United States Patent [19]
Althaus et al.

[11] Patent Number: 4,638,343
[45] Date of Patent: Jan. 20, 1987

[54] OPTICAL RADIATION SOURCE OR DETECTOR DEVICE HAVING PLURAL RADIATING OR RECEIVING CHARACTERISTICS

[75] Inventors: Hans-Ludwig Althaus, Lappersdorf; Jörg Klann, Thumhausen; Wilhelm Kuny, Grünwald, all of Fed. Rep. of Germany

[73] Assignee: Siemens Aktiengesellschaft, Berlin and Munich, Fed. Rep. of Germany

[21] Appl. No.: 723,236

[22] Filed: Apr. 15, 1985

[30] Foreign Application Priority Data

Jan. 4, 1985 [DE] Fed. Rep. of Germany ... 8500013[U]

[51] Int. Cl.$^4$ ............................................. H01L 33/00
[52] U.S. Cl. ........................................ 357/17; 357/30; 357/72; 313/499
[58] Field of Search ..................... 357/72, 73, 17, 30, 357/74; 313/498, 499

[56] References Cited

U.S. PATENT DOCUMENTS 3,821,590 6/1974 Kosman et al. ...................... 313/499
3,821,775 6/1974 Biard .................................... 357/17

FOREIGN PATENT DOCUMENTS 2733937 2/1979 Fed. Rep. of Germany .

Primary Examiner—James W. Davie
Assistant Examiner—Georgia Y. Epps
Attorney, Agent, or Firm—John Francis Moran

[57] ABSTRACT

An optical sender or detector device with an envelope (U) whose light entrance and/or light exit surfaces are adapted to provide a desired radiating or receiving characteristic that is to be able to radiate directionally in two or more spatial directions or respectively to receive directionally from two or more spatial directions. The light entrance and/or light exit surfaces having reflecting curves (R 1, R 2) and lenticular curves (L 1, L 2).

8 Claims, 6 Drawing Figures

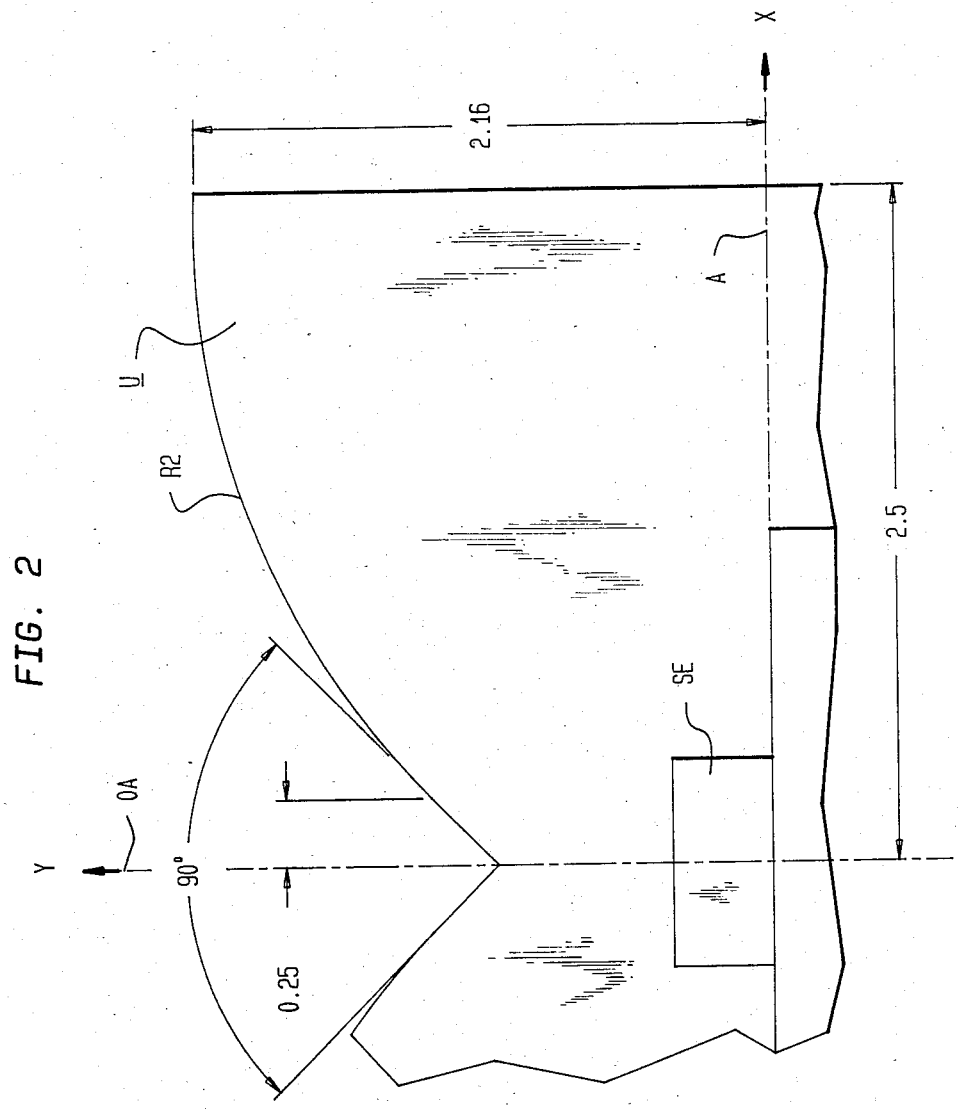

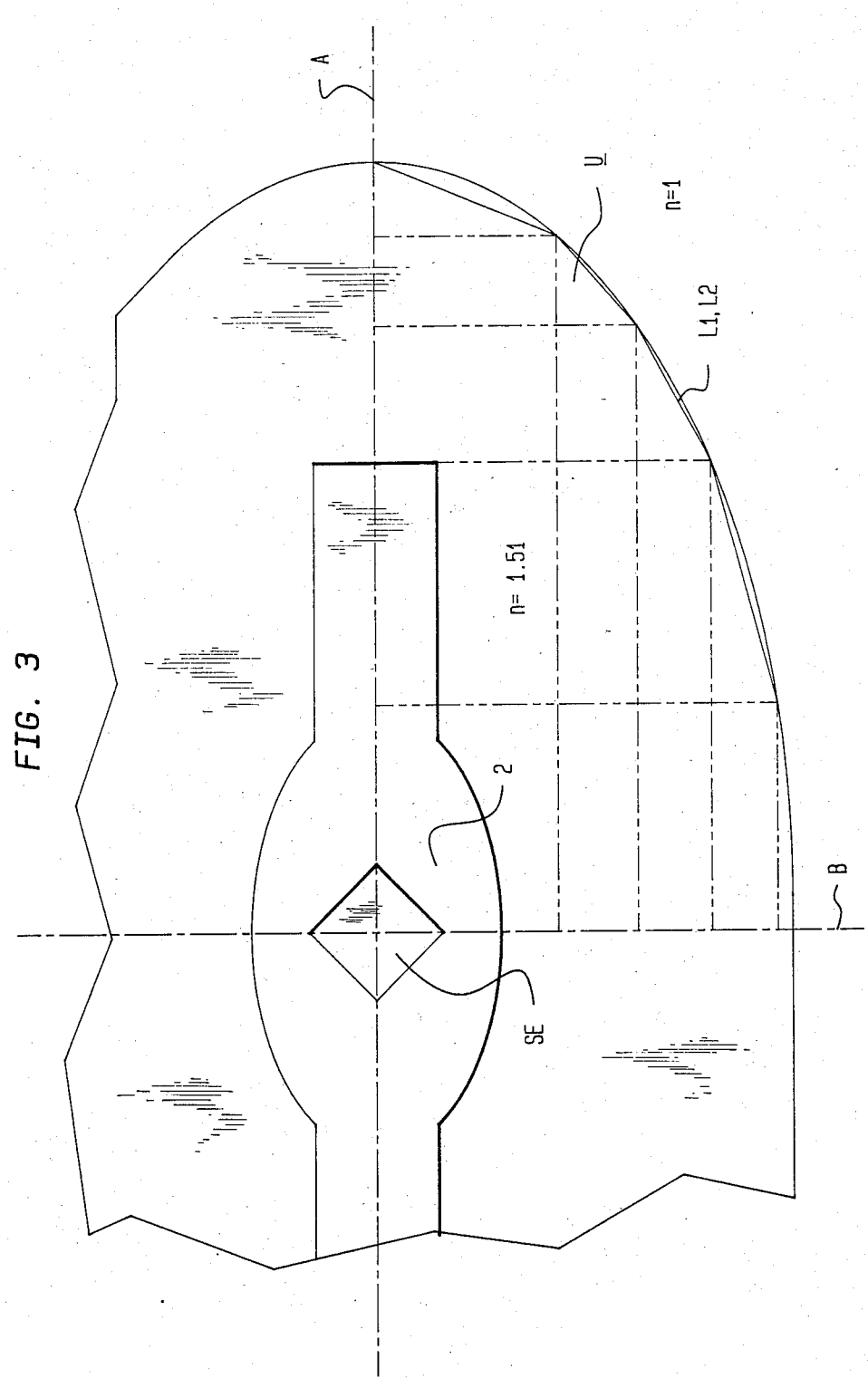

OPTICAL RADIATION SOURCE OR DETECTOR DEVICE HAVING PLURAL RADIATING OR RECEIVING CHARACTERISTICS

BACKGROUND OF THE INVENTION

This invention relates to an optical source or detector device, and, more particularly, it relates to an optical device having a shape whose light entrance and/or light exit surfaces are adapted to provide desired directional radiating and/or receiving properties.

In video recorders, a photo-cell is typically used to turn off the winding motor promptly when the end of the video tape is reached. For this reason, a section of the video tape at the end of the tape is transparent. Due to this design, the winding motor is turned off by the operation of a photo-cell and also if the video tape should break.

Photo-cells are used also in connection with code disks. In this manner, for example location data can be given with high accuracy.

Radiation of light in, or reception of light from, several spatial directions is necessary in typical arrangement including two or more contactless switches.

Heretofore there was used for each radiation direction or for each reception direction a specially oriented optical light source or respectively a specially oriented optical receiver, so that the total construction for an arrangement with more than one radiating directions or for more than one receiving directions is expensive due to electrical power consumption and is further cost-intensive in terms of installation during manufacture. Also the space requirement becomes a multiple of that which an optical single-direction sensor or an optical single-direction receiver requires.

In the German Patent Document Known as "Offenlegungsschrift" No. 2,733,937 an optical sensor device is described with an envelope whose light entrance and/or light exit surfaces are adapted to provide a desired radiating characteristic. In the installation situation of fixed transmission paths, as they exist, e.g. in television transmission from the antenna box to the T.V. screen or in stereo systems from the control equipment to the loudspeaker boxes, stronger beam focusing is thereby possible between a single optical sender and a single optical receiver. It is thus no longer necessary for the signal source to produce such high outputs in order to reliably transmit light signals. With the same output from the signal source, therefore, a higher signal-to-noise ratio is achieved at the receiving end. Also for the signal receiver the reception characteristic can be adapted in this manner, because any stray light can thereby be eliminated better. However, with such conventional optical components the light beam is able to be focused only between a single optical sender and a single optical receiver.

SUMMARY OF THE INVENTION

It is an object of the present invention to provide an optical sender or detector component of the initially mentioned kind with which directional radiation in or directional reception from two or more spatial directions is selectively possible depending on the required directional characteristics with a single optical sender or respectively with a single optical receiver.

According to an aspect of the invention, this problem is solved in that the light entrance and/or light exit surfaces are equipped with lenticular curves for the radiation of light in, or for the reception of light from, two or more spatial directions. Stronger beam focusing is achieved by the fact that the light entrance and/or light exit surfaces have reflecting curves.

A device according to the invention is usable for all those purposes in which radiation is to be radiated in several spatial directions or is to be received from several spatial directions.

In an illustrative device according to the invention, systems for defined, separated radiation in more than one spatial direction or respectively for reception from two or more defined, separate spatial directions are integrated in a single device. The defined, separated spatial directions may be arranged for example in a plane perpendicular to the terminal pins of the optical source or optical receiver. Alternatively, the defined, separated spatial directions may be arranged in almost any manner in three-dimensinal space. These spatial directions are not even confined to the upper hemisphere of space.

Another important aspect of the invention is a highly desirable form of the component envelope having favorable optical characteristics. A particularly convenient manner of producing the component results by forming the envelope out of a sealing compound. In this case, the optical characteristics provided by the shape of the surface through which the light emerges from the envelope is of particular importance.

An optical sender component radiating in several directions or respectively a detector component receiving from several directions (multi-viewing diode) can be manufactured in conventional LED assembly technology. The manufacturing costs for a component according to the invention will thus be like those for a single light-emitting diode.

In a standard embodiment, a Lambert radiator chip may be used as the optical sender device or component. In a high-performance embodiment, a bidirectionally radiation chip, e.g. a laser diode or an edge emitter LED, etc. may be used as the optical sender device or component.

For the optical detector version of this arrangement a suitable photo diode chip such as a differential photo diode etc. may be used. The optical component accordingly becomes a detector which has a precisely defined high photo sensitivity from predetermined spatial directions, e.g. from two opposite spatial directions at an angle of 180°.

In a component according to the invention, the seal of the envelope may be formed so that when using an edge emitter LED, particularly the entire radiation output, i.e. the base emission as well as the edge emission, is radiated in two narrow light beams aligned with one another under 180°.

If the envelope is not sealed so that between the sender chip or the receiver chip and the envelope is a cavity or a material having a different refractive index, then not only the light exiting the surface of the envelope but also at least the light entering surface of the envelope is of importance. After the principles of the invention are known, those working in the art will be readily able to give the surfaces of the envelope various appropriate forms including different forms.

BRIEF DESCRIPTION OF THE DRAWING

Features of the invention and additional aspects and objects of the invention will be more readily appreci

FIG. 2 illustrates the configuration of the reflector curves of the envelope.

FIG. 3 explains the lenticular curves of the envelope.

DETAILED DESCRIPTION

Figure 1A:
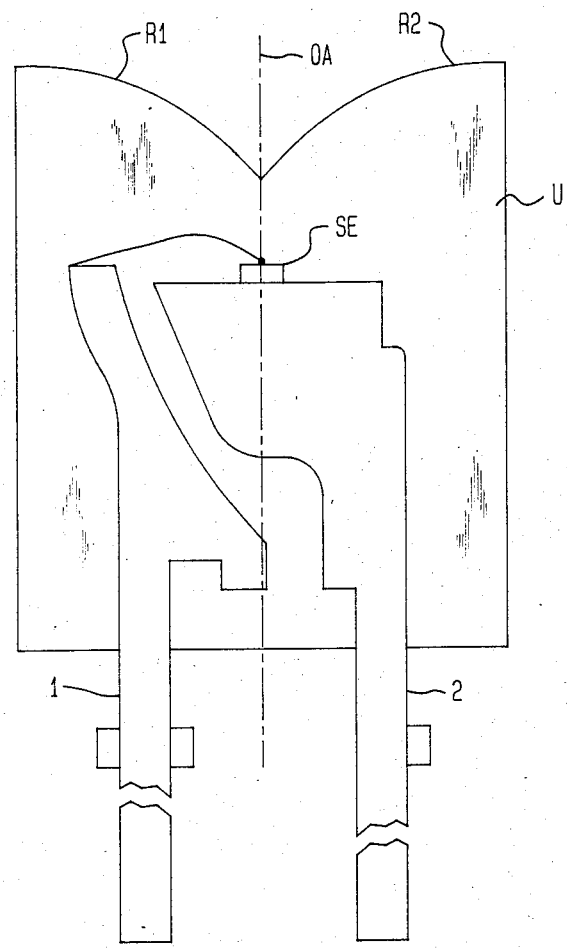
- FIGS. 1A, 1B and 1C depict various views of a bilaterally radiating or bilaterally receiving optical device constructed in accordance with the invention.

FIG. 1A illustrates a bidirectional optical component. Such a component has bidirectional characteristics and may house a radiating or receiving optical detector device. An optical sender chip SE or respectively an optical receiver chip SE is associated with the two retaining elements 1, 2 which also serve as electric leads. The envelope U of the component has internal reflecting curves surfaces R 1, R 2, of the light exit surface, which either reflect the light impinging on the component from the outside onto the detector chip SE or which reflect the light emitted by the sender chip SE in directions perpendicular to the axis OA. The sender chip SE or detector chip SE is positioned centrally on the axis OA to the extent possible.

Figure 1B:
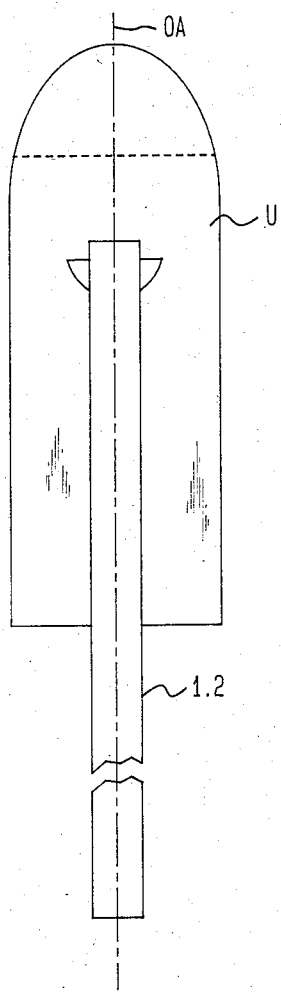

FIG. 1B provides a side view elevation of the optical component of FIG. 1A. It illustrates that the upper portion of the envelope U terminates into a semicircular shaped top symmetrical about vertical axis AO.

Figure 1C:
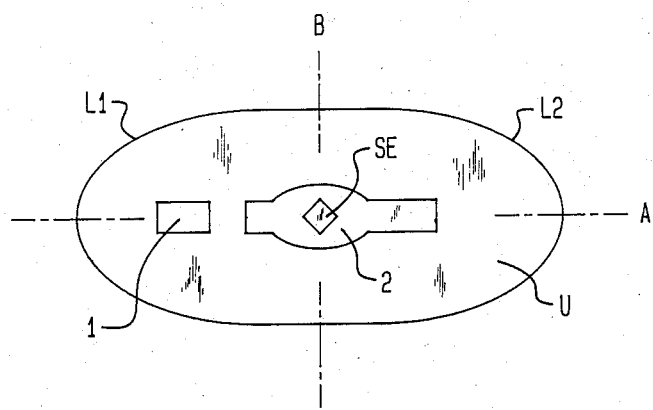

In FIG. 1C, the plane perpendicular to the axis OA containing the chip SE is defined by the two semi-axes A, B. The term semi-axis as used herein is the same as normal or perpendicular with respect to axis OA. In planes which are parallel to the plane defined by semi-axes A, B, the envelope U of the component has lenticular curves L 1, L 2. In connection with the reflecting curves R 1, R 2, these lenticular curves L 1, L 2 contribute either to the focusing of the light impinging on the component from the outside onto the detector chip SE or to the focusing of the light emitted by the sender chip SE and the light reflected by the reflecting curves R 1, R 2 in two spatial directions. One of these two spatial directions coincides with the direction of the semi-axis A, the other of these two spatial directions conforms with the semi-axis A but now at an angle of 180°.

FIG. 2 is an enlarged view useful in explaining the reflecting curves R 1, R 2, of the envelope U. One obtains the reflecting curves R 1, R 2, when the device is made to intersect with that plane which is defined by the axis OA and by the semi-axis A. The two reflecting curves R 1, R 2, form an angle of 90° at the axis OA. The reflecting curves R 1, R 2 are constructed so that the light which, coming from the sender chip SE, impinges on one of the two reflecting curves R 1, R 2 leaves the device in the direction of semi-axis A and parallel to the axis or in the opposite away from semi-axis A. Similarly, the reflecting curves R 1, R 2 are constructed so that light impinging on the component parallel or respectively antiparallel to the semiaxis A, which light is reflected by the reflecting curves R 1, R 2 and is possibly refracted at the lenticular curves, impinges on the receiver chip SE. A suitable refractive index n for the sealing compound of the envelope U is 1.51. With these data and with the laws of optics known to every specialist, the curves R 1, R 2 may be readily determined.

FIG. 3 shows the form of the lenticular curves L 1, L 2, for an image without spherical abberation. If the component is made to intersect with planes which are either defined by the semi-axes A, B or which are parallel to the plane defined by the semi-axes A, B, the envelope U shows lenticular curves L 1, L 2. If a point source radiator is present inside a medium with a refractive index $n > 1$, and if this medium borders on air, all rays emanating within a limited solid angle from the point source, or punctiform radiator, are transformed in air into a parallel beam if the boundary face constitutes a rotated ellipsoid and if the point source radiator lies in the far focus of this rotated ellipsoid. If the envelope U has no reflecting curves, but only lenticular curves, the envelope U constitutes in practice two rotated ellipsoids which have been joined together along the plane which is defined by the axis OA and by the semi-axis B. The point source radiator SE or respectively the omnidirectional receiver SE is present in the far focus of the two rotated ellipsoids. The position tolerance for the center of the chip SE is for infrared radiation within a circle of 0.20 mm radius around the axis OA. The azimuth rotation of the chip SE should not exceed 10°. The sealing form calculated for a central point source radiator should be tolerated positively in the length.

Figure 4:
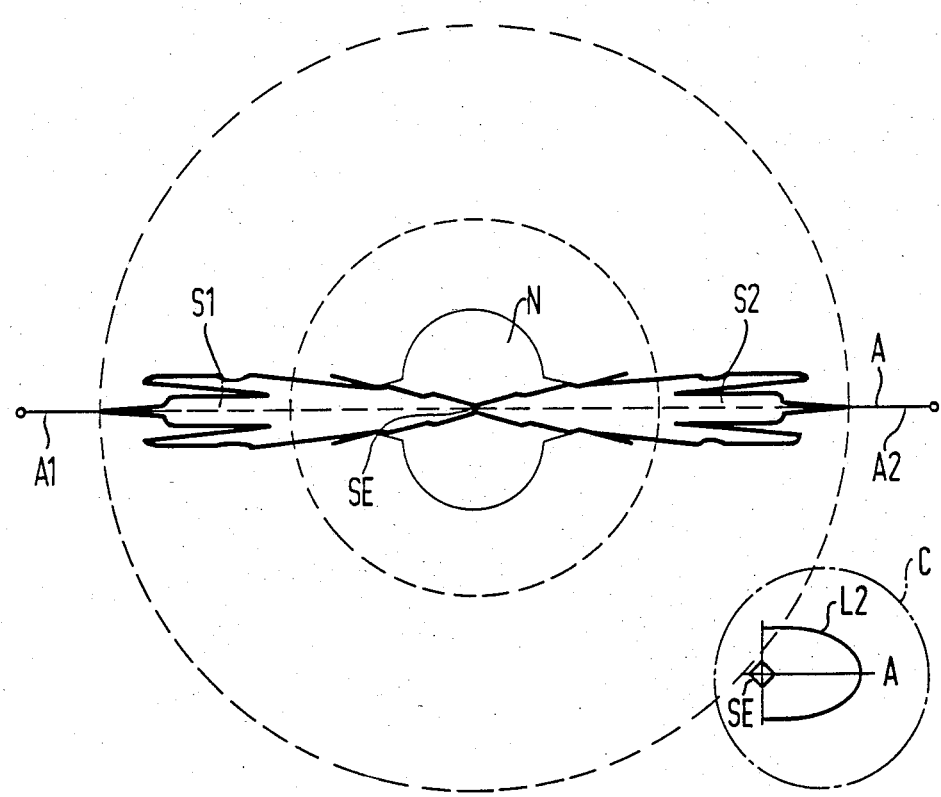
FIG. 4 demonstrates an attainable radiation characteristic for a bidirectionally radiating optical transmitter device employing the inventive principles.

FIG. 4 shows the radiating characteristic of a bidirectionally radiating sender device according to FIG. 1A. For calculating the radiation diagram of the real chip SE with a finite edge length, the point source radiator is replaced by a linear arrangement of several point source radiators along the edges of the chip SE. For each point the individual rays emitted into the half-space (half plane) are observed with respect to their direction (Lambert cosine law) and their refraction on the surface of the sealing substance.

When the refractive index n of the sealing substance is 1.51 and the sealing length in the direction of the main directions is five units, the side length of the radiator is 0.34 unit. The major semi-axis a of the ellipse in the A-B plane is assumed to be 1.504 units, while the minor semi-axis b in the A-B plane is 1.1269. The distance of the focus from the center of the ellipses in the A-B plane is assumed to be 0.996 unit.

Enlargement C in FIG. 4 illustrates the position of chip SE. The indicated main radiation patterns S 1, S 2 correspond to the radiation center of gravity averaged over the respective half-space. the maximum radiation angle is that angle under which the highest intensity within an angle of 1° is radiated. This intensity, referred to the sum of the radiator edges pointing in the same direction, is termed relative maximum radiation intensity and corresponds to the radius of the outer circle of the radiation diagram (normalization 100%). The inner circle corresponds to a normalization of 50%. The averaged relative radiation intensity in axial direction represents the mean of the referred radiation intensities in an angular region of +5° about the desired radiation direction marked S 1, S 2. This value should be of importance mainly for the evaluation of the receiver output to be expected.

In the diagram according to FIG. 4, the relative maximum radiation intensity is 0.0235. The averaged relative radiation intensity is axial direction is 0.0208 in the diagram according to FIG. 4.

In an optical device in accordance with FIG. 1A, two strongly focused light rays emerge from the optical component parallel in the direction of semi-axis A or in the opposite direction.

If the component is to radiate in more than two spatial directions or to receive from more than two spatial directions, the envelope U must be formed so that it has lenticular curves effective for each of these spatial directions and possibly has additionally reflecting curves. For example, several rotated-ellipsoid parts according to FIGS. 1A, 1B and 1C can be fitted together so that the chip SE is arranged for each ellipsoid of rotation in the rear focus.

There has thus been shown and described a novel optical component which fulfills all the objects and advantages sought therefor. Many changes, modifications, variations and other uses and applications of the subject invention will, however, become apparent to those skilled in the art after considering this specification and the accompanying drawings which disclose preferred embodiment thereof. All such changes, modifications, variations and other uses and applications which do not depart from the spirit and scope of the invention are deemed to be covered by the invention which is limited only by the claims which follow.

What is claimed is:

1. An optical device including an envelope (U) having light refractive surfaces which provide a desired optical characteristic, the envelope of the optical device comprising at least two light refractive surfaces having lenticular curves (L 1, L 2) each with a far focus inside the envelope that are coincident in location, the optical device being disposed at the location and the two refractive surfaces defining two light propogation paths from them to the optical device.

2. An optical device according to claim 1, wherein each of the two light propogation paths have a reflecting curve (either R 1 or R 2) for stronger focusing.

3. An optical device according to claim 1, including a Lambert radiator chip serving as a radiation source of light.

4. An optical device according to claim 1, wherein the optical device is an optical sending device being in the form of a bidirectionally radiating chip serving as the radiation source of light.

5. An optical device according to claim 1, including a photo diode chip to receive light.

6. An optical device according to any one of claims 1-5, characterized in that the envelope (U) is sealed and has a uniform refractive index of n whose value is greater than one.

7. An optical device according to any one of claims 1-5, characterized in that the envelope (U) is an enclosed cavity.

8. An optical device according to claim 1, wherein the optical device is an optical detecting device being in the form of a bidirectionally receiving chip serving as the detector of light.

* * * * *